(12) United States Patent
Kawasumi

(10) Patent No.: US 11,024,374 B2
(45) Date of Patent: Jun. 1, 2021

(54) SEMICONDUCTOR MEMORY DEVICE

(71) Applicant: Kioxia Corporation, Tokyo (JP)

(72) Inventor: Atsushi Kawasumi, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 16/560,554

(22) Filed: Sep. 4, 2019

(65) Prior Publication Data
US 2020/0303004 A1    Sep. 24, 2020

(30) Foreign Application Priority Data

Mar. 20, 2019    (JP) ............................. JP2019-053151

(51) Int. Cl.
*G11C 13/00*    (2006.01)
*H01L 27/24*    (2006.01)
*H01L 45/00*    (2006.01)

(52) U.S. Cl.
CPC ...... *G11C 13/0028* (2013.01); *G11C 13/0004* (2013.01); *G11C 13/004* (2013.01); *G11C 13/0026* (2013.01); *G11C 13/0069* (2013.01); *H01L 27/2463* (2013.01); *H01L 45/06* (2013.01); *H01L 45/1233* (2013.01); *H01L 45/143* (2013.01); *H01L 45/144* (2013.01); *G11C 2013/0045* (2013.01); *G11C 2013/0078* (2013.01)

(58) Field of Classification Search
CPC ................................................ G11C 13/0028
USPC ....................................................... 365/163
See application file for complete search history.

(56) References Cited

U.S. PATENT DOCUMENTS

| | | | | |
|---|---|---|---|---|
| 6,584,006 B2* | 6/2003 | Viehmann | ................ | G11C 7/12 365/66 |
| 6,826,069 B2* | 11/2004 | Kurjanowicz | ......... | G11C 5/063 257/E21.656 |
| 8,194,434 B2 | 6/2012 | Toda | | |
| 2013/0064002 A1* | 3/2013 | Terai | ................... | H01L 27/2436 365/148 |
| 2014/0301130 A1* | 10/2014 | Siau | ................... | G11C 13/0069 365/148 |

(Continued)

FOREIGN PATENT DOCUMENTS

| | | |
|---|---|---|
| JP | 2011-54246 A | 3/2011 |
| JP | 2013-200930 A | 10/2013 |

*Primary Examiner* — Muna A Techane
(74) *Attorney, Agent, or Firm* — Foley & Lardner LLP

(57) ABSTRACT

A semiconductor memory device of an embodiment includes: a first wiring disposed at a first level and extending in a first direction; a second and third wirings disposed at a second level and extending in the first direction; a plurality of fourth wirings disposed at a third level and extending in a third direction; a plurality of first resistive change elements disposed in intersection regions of the first and fourth wirings; a plurality of second resistive change elements disposed in intersection regions between the second wiring and the third wiring and the fourth wirings; a first driving circuit electrically connected to the first wiring, a second driving circuit electrically connected to the second wiring, and a third driving circuit electrically connected to the third wiring; and a control circuit that controls the first driving circuit, the second driving circuit, and the third driving circuit, and also the fourth wirings.

15 Claims, 5 Drawing Sheets

(56) References Cited

U.S. PATENT DOCUMENTS

2016/0019961 A1* 1/2016 Ratnam .................... G11C 7/18
                                                    365/148
2017/0062049 A1* 3/2017 Roy ...................... G11C 11/419

* cited by examiner

SEMICONDUCTOR MEMORY DEVICE

CROSS REFERENCE TO RELATED APPLICATIONS

This application is based upon and claims the benefit of priority from the prior Japanese Patent Application No. 2019-053151, filed on Mar. 20, 2019, the entire contents of which are incorporated herein by reference.

FIELD

Embodiments described herein relate generally to semiconductor memory devices.

BACKGROUND

A semiconductor memory is known, which includes a resistive change element such as a phase-change memory element ("PCM element") having a storage layer containing a phase-change material ("PCM") at an intersection region of crossing wirings.

Such semiconductor memories may be stacked and integrated to enable access to plural bits.

When plural bits are accessed, a large voltage drop may occur, which may lead to a decrease in operation margin.

DETAILED DESCRIPTION

Figure 1:
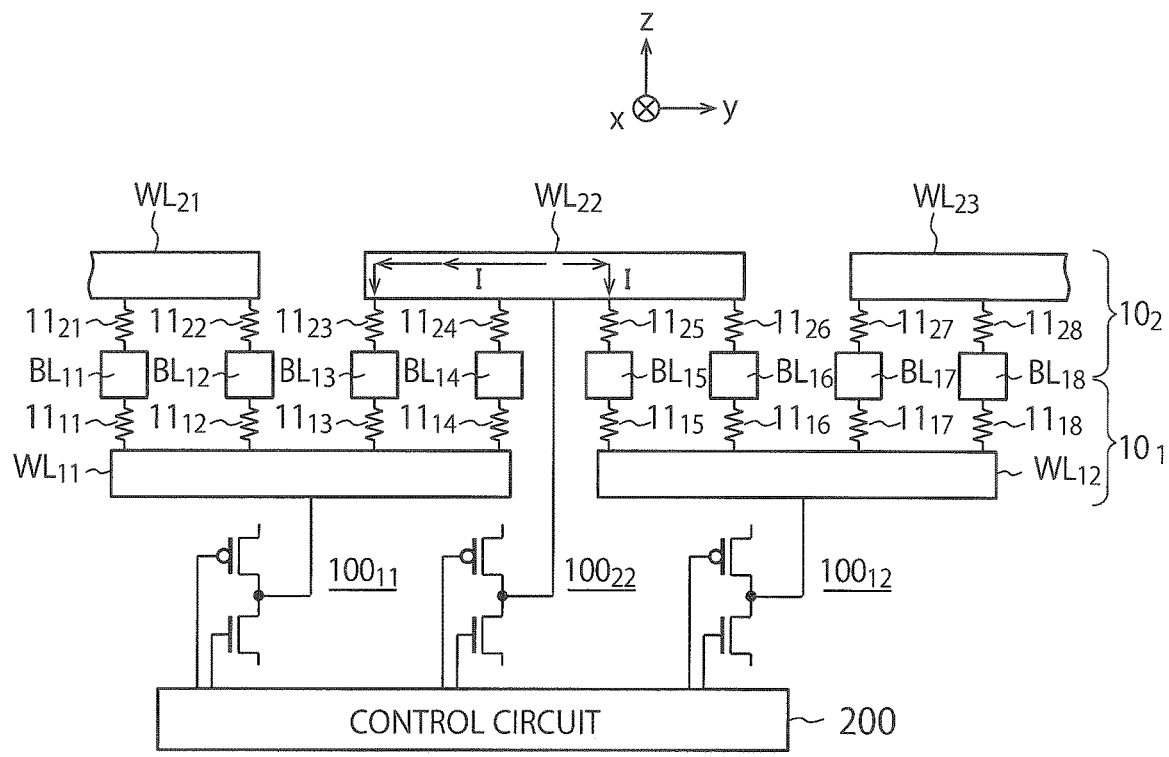
FIG. 1 is a schematic diagram of a semiconductor memory device according to a first embodiment.

A semiconductor memory device according to an embodiment includes: a first wiring disposed at a first level and extending in a first direction; a second wiring and a third wiring disposed at a second level and extending in the first direction to be separate from each other, a position of the second level in a second direction that is perpendicular to the first direction being different from a position of the first level in the second direction; a plurality of fourth wirings disposed at a third level between the first level and the second level, the fourth wirings extending in a third direction crossing the first direction and the second direction; a plurality of first resistive change elements disposed in intersection regions of the first wiring and the fourth wirings, each of the first resistive change elements including a first terminal and a second terminal, the first terminal being electrically connected to the first wiring, and the second terminal being electrically connected to corresponding one of the fourth wirings; a plurality of second resistive change elements disposed in intersection regions between the second wiring and the fourth wirings and between the third wiring and the fourth wirings, each of the second resistive change element including a third terminal and a fourth terminal, the third terminal being electrically connected to a corresponding wiring selected from the second wiring and the third wiring, and the fourth terminal being electrically connected to corresponding one of the fourth wirings; a first driving circuit electrically connected to the first wiring, a second driving circuit electrically connected to the second wiring, and a third driving circuit electrically connected to the third wiring; and a control circuit that controls the first driving circuit, the second driving circuit, and the third driving circuit, and also the fourth wirings, the first resistive change elements being divided into a first group located on one side and a second group located on another side relative to a portion of the first wiring, the second resistive change elements, the third terminal of each of which is electrically connected to the second wiring, being divided into a third group located on one side and a fourth group located on another side relative to a portion of the second wiring, and the second resistive change elements, the third terminal of each of which is electrically connected to the third wiring, being divided into a fifth group located on one side and a sixth group located on another side relative to a portion of the third wiring, the control circuit selecting the first driving circuit to select the first wiring connected to the first driving circuit that is selected, selecting one of the first resistive change elements in the first group, selecting one of the first resistive change elements in the second group, during an operation to access the two first resistive change elements that are selected, providing addresses to be selected simultaneously to two of the fourth wirings, to which the second terminals of the two first resistive change elements that are selected are connected, and providing addresses to be selected simultaneously to the second wiring and the third wiring, to which the third terminals of two second resistive change elements are connected, the fourth terminals of the two second resistive change elements being connected to the two of the fourth wirings.

First Embodiment

Figure 2:
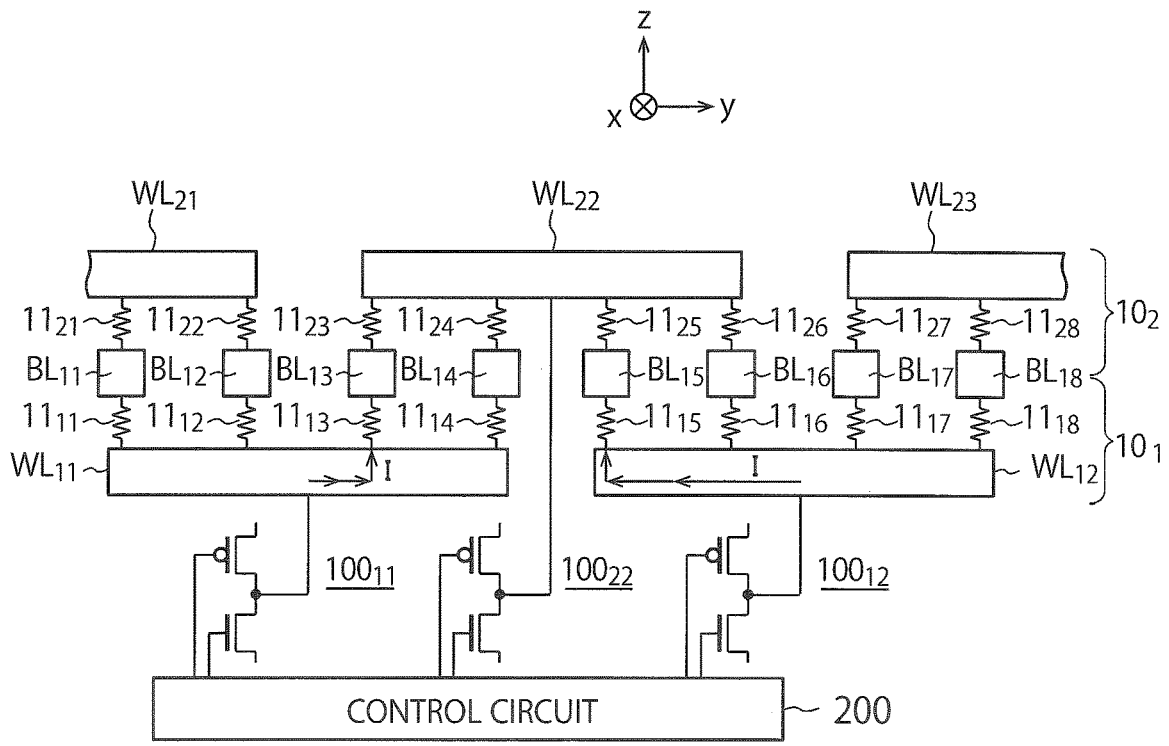
FIG. 2 is a schematic diagram for explaining an operation of the semiconductor memory device according to the first embodiment.

A semiconductor memory device according to a first embodiment will be described with reference to FIGS. 1 and 2. The semiconductor memory device according to the first embodiment has a structure obtained by stacking a first semiconductor memory $10_1$ of a crosspoint type and a second semiconductor memory $10_2$ of a crosspoint type, as shown in FIG. 1. In the following descriptions, resistive change elements are used as storage elements of memory cells. An example of the resistive change element is a PCM element as described in the following descriptions. However, the resistive change element is not limited to the PCM element.

The first semiconductor memory $10_1$ includes a plurality of (two in FIG. 1) word lines $WL_{11}$ and $WL_{12}$, a plurality of (eight in FIG. 1) PCM elements $11_{11}$ to $11_{18}$, and a plurality of (eight in FIG. 1) bit lines $BL_{11}$ to $BL1_{18}$. The word lines $WL_{11}$ and $WL_{12}$, the PCM elements $11_{11}$ to $11_{18}$, and the bit lines $BL_{11}$ to $BL1_{18}$ are arranged at different levels in a z direction (vertical direction in FIG. 1). The positions of the respective levels in the z direction are different from one another.

The word line $WL_{11}$ and the word line $WL_{12}$ extend in a lateral direction to the plane of paper of FIG. 1 (y direction). The bit lines $BL_{11}$ to $BL1_{18}$ extend in a direction perpendicular to the plane of paper of FIG. 1 (x direction). One end of each of the storage elements (PCM elements) $11_{11}$ to $11_{14}$ is electrically connected to the word line $WL_{11}$, and one end of each of the storage elements (PCM elements) $11_{15}$ to $11_{18}$ is electrically connected to the word line $WL_{12}$. The other end of each PCM element $11_{1i}$ (i=1, . . . , 8) is electrically connected to the bit line $BL_{1i}$. The description "A and B are electrically connected" herein means that A and B may be directly connected or indirectly connected via a conductive member disposed between A and B.

The second semiconductor memory $10_2$ includes a plurality of (three in FIG. 1) word lines $WL_{21}$, $WL_{22}$, and $WL_{23}$, a plurality of (eight in FIG. 1) PCM elements $11_{21}$ to $11_{28}$, and a plurality of (eight in FIG. 1) bit lines $BL_{11}$ to $BL_{18}$. Thus, the first semiconductor memory $10_1$ and the second semiconductor memory $10_2$ share the bit lines $BL_{11}$ to $BL_{18}$. The word lines $WL_{21}$, $WL_{22}$, and $WL_{23}$, the PCM elements $11_{21}$ to $11_{28}$, and the bit lines $BL_{11}$ to $BL1_{18}$ are arranged at different levels in the z direction.

The word lines $WL_{21}$, $WL_{22}$, and $WL_{23}$ extend in the y direction. A region between the word line $WL_{21}$ and the word line $WL_{22}$ of the second semiconductor memory $10_2$ is located above a central portion of the word line $WL_{11}$ of the first semiconductor memory $10_1$, and a region between the word line $WL_{22}$ and the word line $WL_{23}$ of the second semiconductor memory $10_2$ is located above a central portion of the word line $WL_{12}$ of the first semiconductor memory $10_1$. Thus, the positions in the y direction of the word lines $WL_{11}$ and $WL_{12}$ included in the first semiconductor memory $10_1$ and the positions in the y direction of the word lines $WL_{21}$, $WL_{22}$, and $WL_{23}$ included in the second semiconductor memory $10_2$ are not the same.

One end of each of the PCM elements $11_{21}$ and $11_{22}$ is electrically connected to the word line $WL_{21}$, and one end of each of the PCM elements $11_{23}$ to $11_{26}$ is electrically connected to the word line $WL_{22}$. One end of each of the PCM elements $11_{27}$ and $11_{28}$ is electrically connected to the word line $WL_{23}$. The other end of the PCM element $11_{2i}$ (i=1, . . . , 8) is electrically connected to the bit line $BL_i$.

One ends of two PCM elements that are not shown in FIG. 1 are electrically connected to each of the word lines $WL_{21}$ and $WL_{23}$, and the other ends are electrically connected to bit lines that are not shown in FIG. 1. Thus, in the semiconductor memory device shown in FIG. 1, one ends of four PCM elements are electrically connected to each word line. The number of PCM elements electrically connected to each word line may be more than four.

The PCM element contains a phase-change material, the phase of which changes between crystal phase and amorphous phase. An example of the phase-change material is a chalcogenide alloy (for example, a GeSbTe alloy). The chalcogenide alloy contains a chalcogenide (GeSbTe). Other examples include a AsSbTe alloy, a TaSbTe alloy, a NbSbTe alloy, a VSbTe alloy, a NbSbSe alloy, a VSbSe alloy, a WSbTe alloy, a MoSbTe alloy, a CrSbTe alloy, a WSbSe alloy, a MoSbSe alloy, a CrSbSe alloy, and a SnSbTe alloy.

A phase-change material changes to the crystal phase having a low resistance value if it is heated, melted, and cooled slowly, and to the amorphous phase having a high resistance value if it is cooled rapidly. Therefore, if a PCM element is heated by applying a voltage between the corresponding word line and the corresponding bit line, and then the voltage is rapidly dropped, the phase-change material of the PCM element is cooled rapidly and changes to the amorphous phase that is in a high-resistance state. If the voltage is dropped slowly, the phase-change material of the PCM element is cooled slowly and changes to the crystal phase that is in a low-resistance state. Data (information) may be written to the PCM element in this manner. The data (information) may be read from the PCM element by applying a voltage between the corresponding word line and the corresponding bit line, and measuring a current caused to flow by the voltage application, thereby measuring the resistance of the PCM element, for example.

The semiconductor memory device shown in FIG. 1 also includes driving circuits $100_{11}$, $100_{12}$, and $100_{22}$ that drive the respective word lines, and a control circuit 200 that controls the driving circuits. For example, the word lines $WL_{11}$, $WL_{12}$, and $WL_{22}$ are connected to the driving circuits $100_{11}$, $100_{12}$, and $100_{22}$, respectively. The word lines $WL_{21}$ and $WL_{23}$ are also connected to driving circuits that are not shown in FIG. 1. The control circuit 200 also controls the corresponding bit line connected to the PCM element to be accessed.

Each driving circuit includes a p-channel transistor and an n-channel transistor connected in series. The gate of each of the series-connected p-channel transistor and n-channel transistor is connected to the control circuit 200. An intermediate node (connection node) of the series-connected transistors is electrically connected to the central portion of the corresponding word line. Each of the driving circuits supplies a write current or a read current via the corresponding word line to the PCM element to be accessed.

The PCM elements connected to each word line are divided into two groups at a portion (for example, the center) of the word line to which a corresponding driving circuit is connected. The number of PCM elements included in one of the two groups may be the same as or different from the number of PCM elements in the other. In the following descriptions, the PCM elements are divided into the two groups at the center of the word line. However, any position other than the center may be selected.

In the semiconductor memory device according to the first embodiment having the above-described structure, for example, the driving circuit $100_{22}$ is selected by the control circuit 200, and the PCM element $11_{23}$ disposed to one side of the word line $WL_{22}$ relative to the center of the word line $WL_{22}$ and the PCM element $11_{25}$ disposed to the other side are to be accessed. The control circuit 200 then selects the bit lines $BL_{13}$ and $BL_{15}$. The driving circuit $100_{22}$ supplies a current I to the PCM element $11_{23}$ and the PCM element $11_{25}$ via the word line $WL_{22}$ to perform a write operation or a read operation. In this case, the addresses to be selected at the same time are assigned to the bit line $BL_{13}$ and the bit line $BL_{15}$ electrically connected to the PCM element $11_{23}$ and the PCM element $11_{25}$.

After the addresses to be selected at the same time are assigned to the bit line $BL_{13}$ and the bit line $BL_{15}$, the control circuit 200 drives the word line $WL_{11}$ by using the driving circuit $100_{11}$ and selects the bit line $BL_{13}$ to access the PCM element $11_{13}$ electrically connected to the word line $WL_{11}$ and the bit line $BL_{13}$. At this time, the bit line $BL_{15}$, to which the address to be selected has been assigned at the same time as the bit line $BL_{13}$, is also selected. Therefore, in the first embodiment, the control circuit 200 drives the word line $WL_{12}$ via the driving circuit $100_{12}$. As a result, the PCM element $11_{15}$ connected to the bit line $BL_{15}$ and the word line $WL_{12}$ is also accessed. Thus, the PCM element $11_{13}$ and the PCM element $11_{15}$ corresponding to two bits may be accessed at the same time. Accordingly, as shown in FIG. 2, a current I is supplied to the PCM element $11_{13}$ and the PCM element $11_{15}$ via the word line $WL_{11}$ and the word line $WL_{12}$ to perform a write operation or a read operation. In this embodiment, the word lines $WL_{11}$, $WL_{12}$, $WL_{21}$, $WL_{22}$, and $WL_{23}$ are located on a section of the semiconductor memory device sectioned by a y-z plane. Therefore, the same physical row address may be provided to those word lines, for example.

COMPARATIVE EXAMPLE

Figure 3:
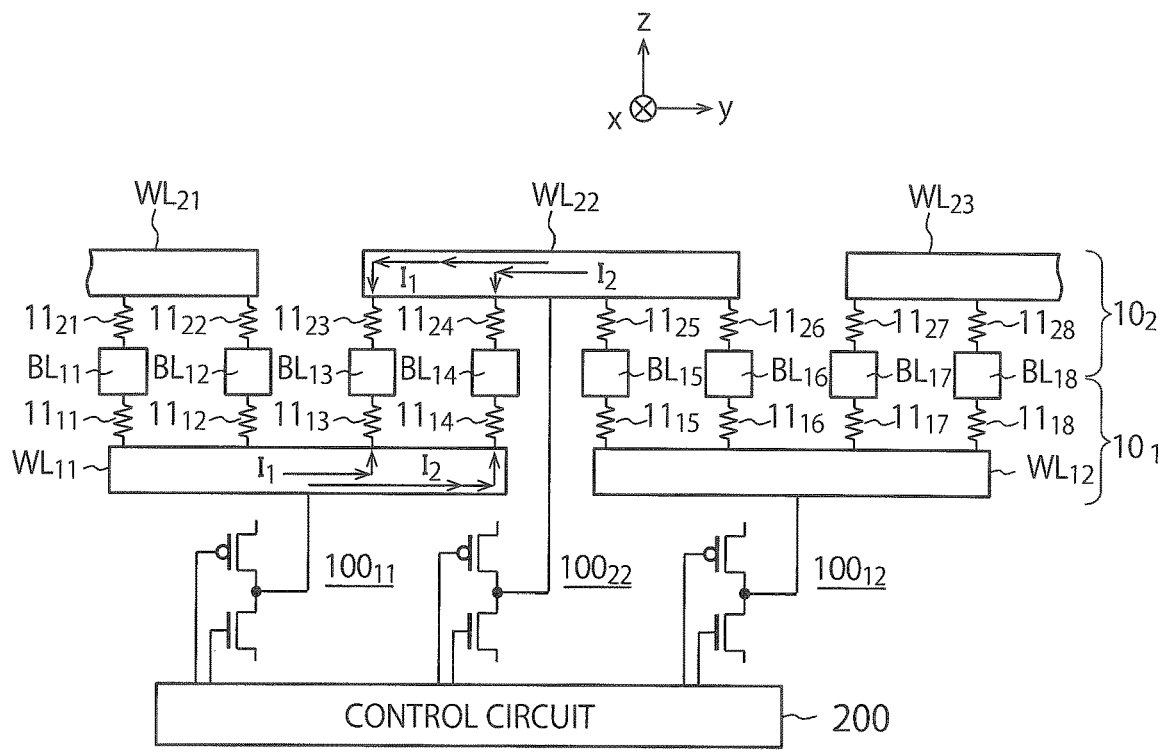
FIG. 3 is a schematic diagram for explaining a problem of a semiconductor memory device according to a comparative example.

A semiconductor memory device according to comparative examples will be described with reference to FIGS. 3 and 4. FIG. 3 shows the semiconductor memory device according to a comparative example. The semiconductor memory device according to the comparative example has the same structure as the semiconductor memory device according to the first embodiment shown in FIG. 1, but differs from the semiconductor memory device according to the first embodiment in the method of accessing two PCM elements. The semiconductor device according to the comparative example also accesses two bits at the same time. For example, the driving circuit $100_{22}$ drives the word line $WL_{22}$ to simultaneously access two PCM elements $11_{23}$ and $11_{24}$ disposed on the left side relative to the center of the word line $WL_{22}$ in FIG. 3. In this case, the bit lines $BL_{13}$ and $BL_{14}$ connected to the two PCM elements $11_{23}$ and $11_{24}$ are selected at the same time. Therefore, the addresses to be selected at the same time are assigned to the bit lines $BL_{13}$ and $BL_{14}$. When a current is supplied between the word line $WL_{22}$ and the bit lines $BL_{13}$ and $BL_{14}$ by means of the driving circuit $100_{22}$, a current $I_1$ flows through the PCM element $11_{23}$ and a current $I_2$ flows through the PCM element $11_{24}$.

When the bit lines $BL_{13}$ and $BL_{14}$ have the addresses to be selected at the same time, the driving circuit $100_{11}$ drives the word line $WL_{11}$. As a result, the PCM elements $11_{13}$ and $11_{14}$ connected to the bit lines $BL_{13}$ and $BL_{14}$, respectively, are accessed. At this time, a current $I_1$ flows through the PCM element $11_{13}$ and a current $I_2$ flows through the PCM element $11_{14}$. Thus, when one of the word lines $WL_{11}$ of the first semiconductor memory $10_1$ is driven, two bits (PCM elements $11_{13}$ and $11_{14}$) are accessed, and one of the word lines $WL_{22}$ of the second semiconductor memory $10_2$ is driven, two bits (PCM elements $11_{23}$ and $11_{24}$) are selected. In this case, however, the accessed PCM elements are located on one side relative to the center of the driven word line. Therefore, the degree of voltage drop caused by a current that flows with the access becomes large. The large current decreases the operation margin.

Figure 4:
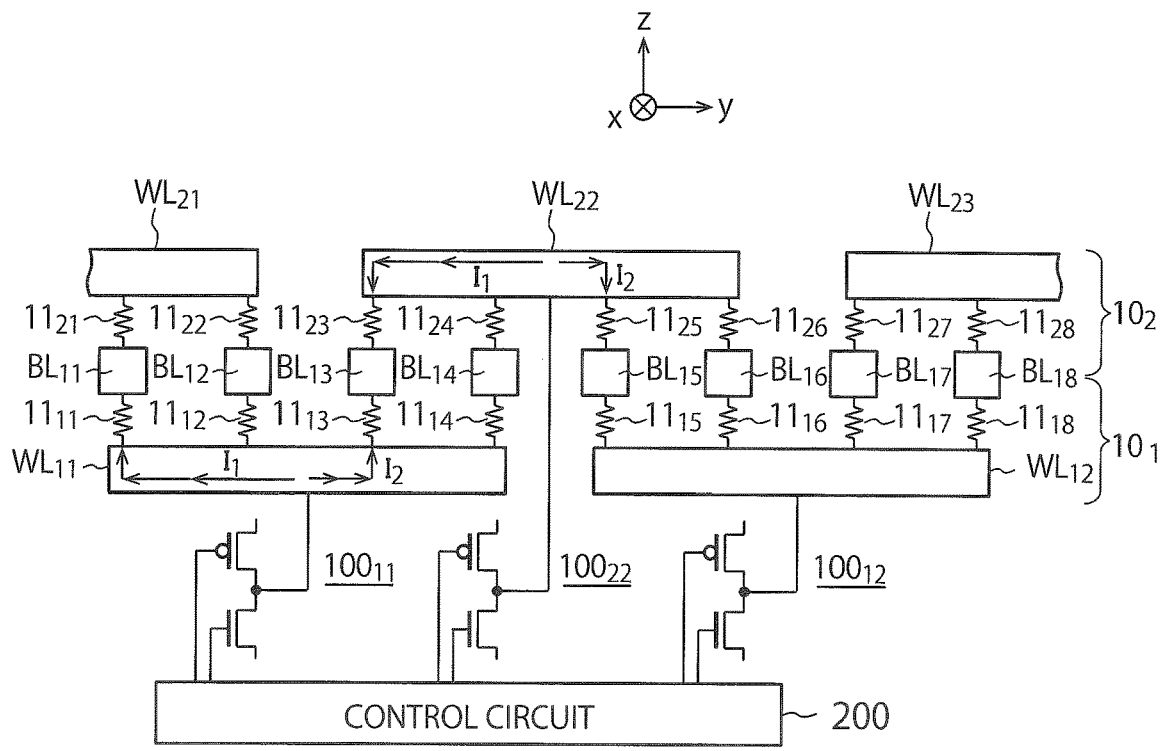
FIG. 4 is a schematic diagram for explaining a problem of a semiconductor memory device according to another comparative example.

FIG. 4 shows a case where one PCM element is selected from one side relative to the center of the word line, and the other PCM element is selected from the other side in order to reduce the influence of the voltage drop. The semiconductor memory device shown in FIG. 4 has the same structure as the semiconductor memory device shown in FIG. 3. For example, the driving circuit $100_{22}$ drives the word line $WL_{22}$ to simultaneously access the PCM element $11_{23}$ located on one side relative to the center of the word line $WL_{22}$ and the PCM element $11_{25}$ located on the other side. In this case, addresses to be selected at the same time are provided to the bit line $BL_{13}$ and the bit line $BL_{15}$ connected to the PCM element $11_{23}$ and the PCM element $11_{25}$, respectively. When the driving circuit $100_{22}$ drives the PCM element $11_{23}$ and the PCM element $11_{24}$ via the word line $WL_{22}$, a current $I_1$ is supplied to the PCM element $11_{23}$ and a current $I_2$ is supplied to the PCM element $11_{24}$.

The addresses to be selected at the same time have been given to the bit line $BL_{13}$ and the bit line $BL_{15}$. Then, the driving circuit $100_{11}$ drives the word line $WL_{11}$ to simultaneously access the PCM element $11_{11}$ located on the one side relative to the center and the PCM element $11_{13}$ located on the other side. This means that the driving circuit $100_{11}$ supplies a current $I_1$ and a current $I_2$ to the PCM element $11_{11}$ and the PCM element $11_{13}$ via the word line $WL_{11}$. When the addresses to be selected at the same time are provided to the bit line $BL_{13}$ and the bit line $BL_{15}$, the bit line $BL_{11}$ to which the PCM element $11_{11}$ is connected and the bit line $BL_{13}$ to which the PCM element $11_{13}$ is connected need to have the addresses to be selected at the same time. Thus, if the word line $WL_{22}$ is driven, the addresses to be selected at the same time need to be provided to the bit line $BL_{13}$ and the bit line $BL_{15}$, and if the word line $WL_{11}$ is driven, the addresses to be selected at the same time need to be provided to the bit line $BL_{11}$ and the bit line $BL_{13}$. This causes a problem in that the assignment of addresses to be selected to bit lines becomes complicated.

In contrast, when two PCM elements (for example, the PCM elements $11_{23}$ and $11_{25}$), one ends of which are electrically connected to a single word line (for example, the word line $WL_{22}$), are accessed at the same time in the first embodiment shown in FIG. 1, two other PCM elements (for example, the PCM elements $11_{13}$ and $11_{15}$), one ends of which are connected to two bit lines (for example, the bit lines $BL_{13}$ and $BL_{15}$), to which the other ends of the previously accessed two PCM elements $11_{23}$ and $11_{25}$ are connected, are also made accessible at the same time. Therefore, the control circuit 200 also controls the word lines (for example, the word lines $WL_{11}$ and $WL_{12}$) to which the other ends of the PCM elements (the PCM elements $11_{13}$ and $11_{15}$) are connected. One of the two PCM elements, one ends of which are electrically connected to the single word line (the word line $WL_{22}$) and which are accessible at the same time, is disposed on one side relative to the center of the single word line, and the other is disposed on the other side. This may leads to the reduction of the influence of a voltage drop caused by a read current or a write current, thereby curbing the decrease in operation margin. The two word lines (the word lines $WL_{11}$ and $WL_{12}$) that are selected later are adjacent to each other in the same semiconductor memory (for example, the semiconductor memory $10_1$). This may prevent the complication in assigning addresses to be selected at the same time.

As described above, the semiconductor memory device according to the first embodiment may be capable of preventing the decrease in operation margin and also the complication in assigning addresses to be selected simultaneously.

Second Embodiment

Figure 5:
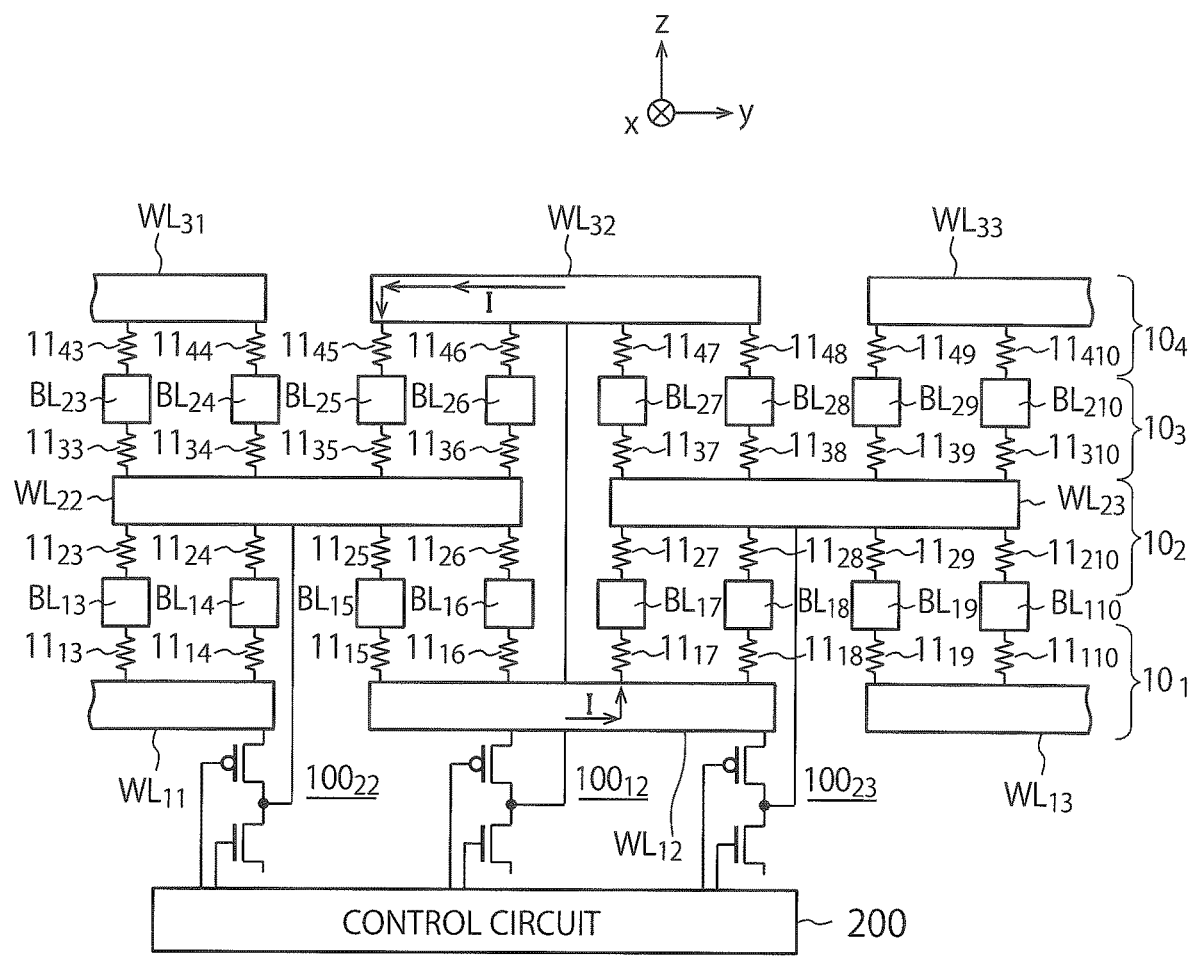
FIG. 5 is a schematic diagram of a semiconductor memory device according to a second embodiment.

A semiconductor memory device according to a second embodiment will be described with reference to FIGS. 5 and 6. The semiconductor memory device according to the second embodiment has a structure in which first to fourth semiconductor memories $10_1$, $10_2$, $10_3$, and $10_4$ of a crosspoint type are stacked in the z direction (vertical direction in FIGS. 5 and 6).

The first semiconductor memory $10_1$ includes a plurality of (three in FIG. 5) word lines $WL_{11}$, $WL_{12}$, and $WL_{13}$, a plurality of (eight in FIG. 5) PCM elements $11_{13}$ to $11_{110}$, and a plurality of (eight in FIG. 5) bit lines $BL_{13}$ to $BL_{110}$. The word lines $WL_{12}$, and $WL_{13}$, the PCM elements $11_{13}$ to $11_{110}$, and the bit lines $BL_{13}$ to $BL_{110}$ are disposed at different levels in the z direction.

The word lines $WL_{11}$, the word line $WL_{12}$, and the word line $WL_{13}$ extend in the lateral direction to the plane of paper (y direction). The bit lines $BL_{13}$ to $BL1_{110}$ extend in the direction perpendicular to the plane of paper of FIG. 5 (x direction). One end of each of the storage elements (PCM elements) $11_{13}$ and $11_{14}$ is electrically connected to the word line $WL_{11}$, and one end of each of the storage elements (PCM elements) $11_{15}$ to $11_{18}$ is electrically connected to the word line $WL_{12}$. One end of each of the storage elements (PCM elements) $11_{19}$ and $11_{110}$ is electrically connected to the word line $WL_{13}$. The other end of the PCM element $11_i$ (i=3, ..., 10) is connected to the bit line $BL_i$.

The second semiconductor memory $10_2$ includes a plurality of (two in FIG. 5) word lines $WL_{22}$ and $WL_{23}$, a plurality of (eight in FIG. 5) PCM elements $11_{23}$ to $11_{210}$, and a plurality of (eight in FIG. 5) bit lines $BL_{13}$ to $BL_{110}$. Thus, the first semiconductor memory $10_1$ and the second semiconductor memory $10_2$ share the plural (eight in FIG. 5) bit lines $BL_{13}$ to $BL1_{110}$. The word lines $WL_{22}$ and $WL_{23}$, the PCM elements $11_{23}$ to $11_{210}$, and the bit lines $BL_{13}$ to $BL_{110}$ are disposed at different levels in the z direction.

The word lines $WL_{22}$ and $WL_{23}$ extend in the y direction. The word lines are arranged so that a central portion of the word line $WL_{12}$ included in the first semiconductor memory $10_1$ is located below a space between the word line $WL_{22}$ and the word line $WL_{23}$, a central portion of the word line $WL_{22}$ included in the second semiconductor memory $10_2$ is located above a space between the word line $WL_{11}$ and the word line $WL_{12}$, and a central portion of the word line $WL_{23}$ included in the second semiconductor memory $10_2$ is located above a space between the word line $WL_{12}$ and the word line $WL_{13}$. Thus, the positions in the y direction of the word lines $WL_{11}$, $WL_{12}$, and $WL_{13}$ included in the first semiconductor memory $10_1$ and the positions in the y direction of the word lines $WL_{22}$ and $WL_{23}$ included in the second semiconductor memory $10_2$ are not the same.

One end of each of the PCM elements $11_{23}$ to $11_{26}$ is electrically connected to the word line $WL_{22}$, and one end of each of the PCM elements $11_{27}$ to $11_{210}$ is electrically connected to the word line $WL_{23}$. The other end of the PCM element $11_{2i}$ (i=3, ..., 10) is electrically connected to the bit line $BL_i$.

The third semiconductor memory $10_3$ includes a plurality of (two in FIG. 5) word lines $WL_{22}$ and $WL_{23}$, a plurality of (eight in FIG. 5) PCM elements $11_{33}$ to $11_{310}$, and a plurality of (eight in FIG. 5) bit lines $BL_{23}$ to $BL_{210}$. Thus, the second semiconductor memory $10_2$ and the third semiconductor memory $10_3$ share the word lines $WL_{22}$ to $WL_{23}$. The bit lines $BL_{23}$ to $BL_{210}$ extend in the x direction. The word lines $WL_{22}$ and $WL_{23}$, the PCM elements $11_{33}$ to $11_{310}$, and the bit lines $BL_{23}$ to $BL_{210}$ are disposed at different levels in the z direction.

One end of each of the PCM elements $11_{33}$ to $11_{36}$ is electrically connected to the word line $WL_{22}$, and one end of each of the PCM elements $11_{37}$ to $11_{310}$ is electrically connected to the word line $WL_{23}$. The other end of the PCM element $11_{3i}$ (i=3, ..., 10) is electrically connected to the bit line $BL_{2i}$.

The fourth semiconductor memory $10_4$ includes a plurality of (three in FIG. 5) word lines $WL_{31}$, $WL_{32}$, and $WL_{33}$, a plurality of (eight in FIG. 5) PCM elements $11_{43}$ to $11_{410}$, and a plurality of (eight in FIG. 5) bit lines $BL_{23}$ to $BL_{210}$. Thus, the fourth semiconductor memory $10_4$ and the third semiconductor memory $10_3$ share the bit lines $BL_{23}$ to $BL_{210}$. The word lines $WL_{31}$, $WL_{32}$, and $WL_{33}$, the PCM elements $11_{43}$ to $11_{410}$, and the bit lines $BL_{23}$ to $BL_{210}$ are disposed at different levels in the z direction.

The word lines $WL_{31}$, $WL_{32}$, and $WL_{33}$ extend in the y direction. The word lines are arranged so that a region between the word line $WL_{22}$ and the word line $WL_{23}$ included in the third semiconductor memory $10_3$ is disposed below a central portion of the word line $WL_{32}$ of the fourth semiconductor memory $10_4$, a region between the word line $WL_{31}$ and the word line $WL_{32}$ is disposed above the central portion of the word line $WL_{22}$, and a region between the word line $WL_{32}$ and the word line $WL_{33}$ is disposed above the central portion of the word line $WL_{23}$. Thus, the positions in the y direction of the word lines $WL_{31}$, $WL_{32}$, and $WL_{33}$ included in the fourth semiconductor memory $10_4$ and the positions in the y direction of the word lines $WL_{22}$ and $WL_{23}$ included in the third semiconductor memory $10_3$ are not the same.

One end of each of the PCM elements $11_{43}$ and $11_{44}$ is electrically connected to the word line $WL_{31}$. One end of each of the PCM elements $11_{45}$ to $11_{48}$ is electrically connected to the word line $WL_{32}$. One end of each of the PCM elements $11_{49}$ and $11_{410}$ is electrically connected to the word line $WL_{33}$. The end of the PCM element $11_{4i}$, (i=3, ..., 10) is electrically connected to the bit line $BL_{2i}$.

One ends of two PCM elements that are not shown are electrically connected to each of the word lines $WL_{11}$ and $WL_{13}$, and the other ends are electrically connected to bit lines that are not shown. One ends of two PCM elements that are not shown are electrically connected to each of the word lines $WL_{31}$ and $WL_{33}$, and the other ends are electrically connected to bit lines that are not shown. Thus, in the semiconductor memory according to the second embodiment shown in FIG. 5, one end of each of four PCM elements is electrically connected to a word line. However, the number of electrically connected PCM elements may be more than four.

In the second embodiment, the word lines $WL_{11}$, $WL_{12}$, $WL_{13}$, $WL_{22}$, $WL_{23}$, $WL_{31}$, $WL_{32}$, and $WL_{33}$ are located on a section of the semiconductor device sectioned by a y-z plane. Therefore, for example, the same physical row address may be given to those word lines.

The semiconductor memory device according to the second embodiment also includes driving circuits $100_{12}$, $100_{22}$, and $100_{23}$ that drive the respective word lines and a control circuit 200. In the case of FIG. 5, for example, the driving circuit $100_{22}$ is provided to deal with the word line $WL_{22}$, the driving circuit $100_{12}$ is provided to deal with the word lines $WL_{12}$ and $WL_{32}$, and the driving circuit $100_{23}$ is provided to deal with the word line $WL_{23}$. Thus, in the second embodiment, the word line $WL_{12}$ included in the first semiconductor memory $10_1$ and the word line $WL_{32}$ included in the fourth semiconductor memory $10_4$ and disposed at a position corresponding to that of the word line $WL_{12}$ are connected to the same driving circuit $100_{12}$. Each driving circuit is electrically connected to a central portion of the corresponding word line. Each of the driving circuits supplies a write current or a read current to a PCM element to be accessed via a corresponding word line. The PCM elements connected to each word line are divided into two groups at the center of the word line. The number of PCM elements included in one of the two groups may be the same as or different from the number of PCM elements included in the other.

Each driving circuit includes a p-channel transistor and an n-channel transistor connected in series. The gate of each of the series-connected p-channel transistor and n-channel transistor is connected to the control circuit 200. An intermediate node (connection node) of the series-connected transistors is electrically connected to a central portion of the corresponding word line. The control circuit 200 also controls the corresponding bit line connected to the PCM element to be accessed.

The semiconductor memory device according to the second embodiment having the above-described structure is capable of accessing two bits at a time. For example, the control circuit 200 selects the driving circuit $100_{12}$ to access a PCM element $11_{17}$ included in a group on the right side relative to the center of the word line $WL_{12}$, and to access a PCM element $11_{45}$ included in a group on the left side relative to the center of the word line $WL_{32}$. At this time, the control circuit 200 also selects the bit lines $BL_{17}$ and $BL_{25}$.

Thereafter, the driving circuit $100_{12}$ supplies a current to the PCM element $11_{17}$ via the word line $WL_{12}$ and to the PCM element $11_{45}$ via the word line $WL_{32}$ in order to perform a write operation or a read operation. At this time, addresses to be selected at the same time are assigned to the bit line $BL_{17}$ and the bit line $BL_{25}$ electrically connected to the PCM element $11_{17}$ and the PCM element $11_{45}$, respectively, in this embodiment.

Figure 6:
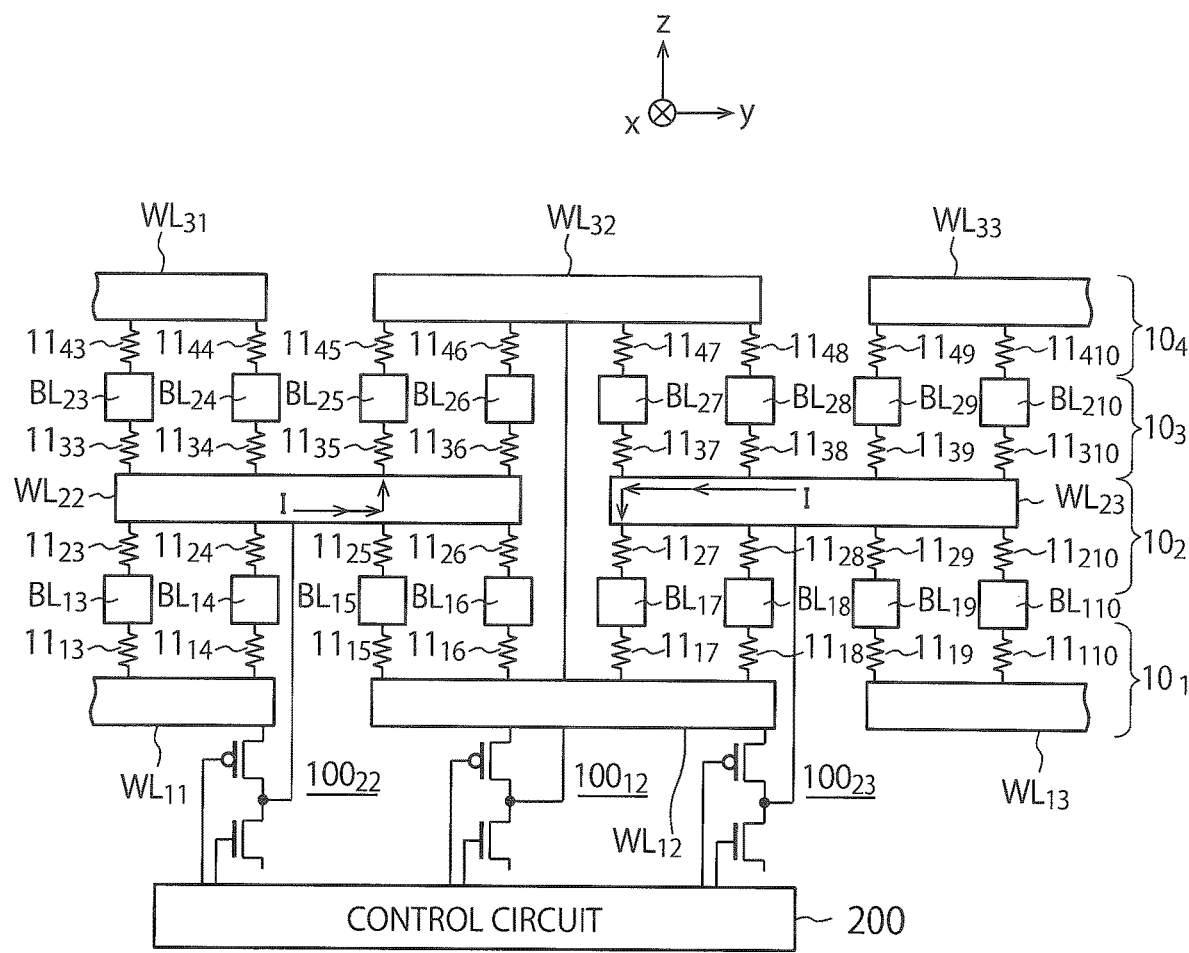
FIG. 6 is a schematic diagram of the semiconductor memory device according to the second embodiment.

After the addresses to be selected at the same time are assigned to the bit line $BL_{17}$ and the bit line $BL_{45}$, the control circuit 200 uses the driving circuit $100_{23}$ to drive the word line $WL_{23}$ and selects the bit line $BL_{17}$ to access the PCM element $11_{27}$ that is electrically connected between the word line $WL_{23}$ and the bit line $BL_{17}$ as shown in FIG. 6. At this time, the bit line $BL_{25}$, to which the address to be selected is assigned at the same time as the bit line $BL_{17}$, has been selected. Therefore, in the second embodiment, the control circuit 200 drives the word line $WL_{22}$ by means of the driving circuit $100_{22}$. As a result, the PCM element $11_{35}$ that is electrically connected to the bit line $BL_{25}$ and the word line $WL_{22}$ is also accessed. Thus, the PCM element $11_{35}$ and the PCM element $11_{27}$, which make two bits, can be accessed simultaneously. A write operation or a read operation may be performed by supplying a current I to the PCM element $11_{35}$ and the PCM element $11_{27}$ via the word line $WL_{22}$ and the word line $WL_{23}$, respectively, as shown in FIG. 6.

As described above, when two PCM elements (for example, the PCM elements $11_{17}$ and $11_{45}$), one ends of which are electrically connected to two word lines $WL_{12}$ and $WL_{32}$, are simultaneously accessed, two PCM elements (for example, the PCM elements $11_{27}$ and $11_{35}$), one ends of which are connected to two bit lines (for example, the bit lines $BL_{17}$ and $BL_{25}$), to which the other ends of the previously accessed two PCM elements (the PCM elements $11_{17}$ and $11_{45}$) are electrically connected, are accessible. The control circuit 200 then controls two word lines (for example, the word lines $WL_{22}$ and $WL_{23}$), to which the other ends of the PCM elements to be accessed (the PCM elements $11_{27}$ and $11_{35}$) are connected, so that they may be accessed simultaneously. When two PCM elements that are electrically connected to a word line are simultaneously accessed, one of the two PCM elements that are electrically connected to the word line is disposed on the right side relative to the center of the word line, and the other is disposed on the left side. This may reduce the influence of a voltage drop caused by a read current or a write current, and may prevent the decrease in operation margin. The two driven word lines (the word lines $WL_{22}$ and $WL_{23}$) are adjacent to each other in the same semiconductor memory (for example, the semiconductor memory $10_2$). This may prevent the complication in assigning addresses simultaneously.

In the second embodiment, when two PCM elements (for example, the PCM elements $11_{15}$ and $11_{17}$), one ends of which are electrically connected to a single word line (for example, the word line $WL_{12}$), are accessed at the same time, like the first embodiment, two other PCM elements (for example, the PCM elements $11_{25}$ and $11_{27}$), one ends of which are connected to two bit lines (for example, the bit lines $BL_{15}$ and $BL_{17}$), to which the other ends of the previously accessed two PCM elements (the PCM elements $11_{15}$ and $11_{17}$) are electrically connected, are also made accessible at the same time. In order to do so, the control circuit 200 controls the two word lines (for example, the word lines $WL_{22}$ and $WL_{23}$), to which the other ends of the PCM elements (the PCM elements $11_{15}$ and $11_{17}$) are connected, so that the two word lines become accessible. One of the two PCM elements, one ends of which are electrically connected to the single word line (the word line $WL_{12}$) and which are accessible at the same time, is disposed on one side relative to the center of the word line, and the other is disposed on the other side. Also in this case, the influence of the voltage drop caused by the read current or the write current may be reduced, and the decrease in operation margin may be prevented. The two word lines that are driven later (the word lines $WL_{22}$ and $WL_{23}$) are adjacent to each other in the same semiconductor memory (for example, the semiconductor memory $10_2$). This may prevent the complication in assigning addresses to be selected simultaneously.

The semiconductor memory device having the above-described structure may prevent the decrease in operation margin, and may prevent the complication in assigning addresses to be selected simultaneously.

Third Embodiment

Figure 7:
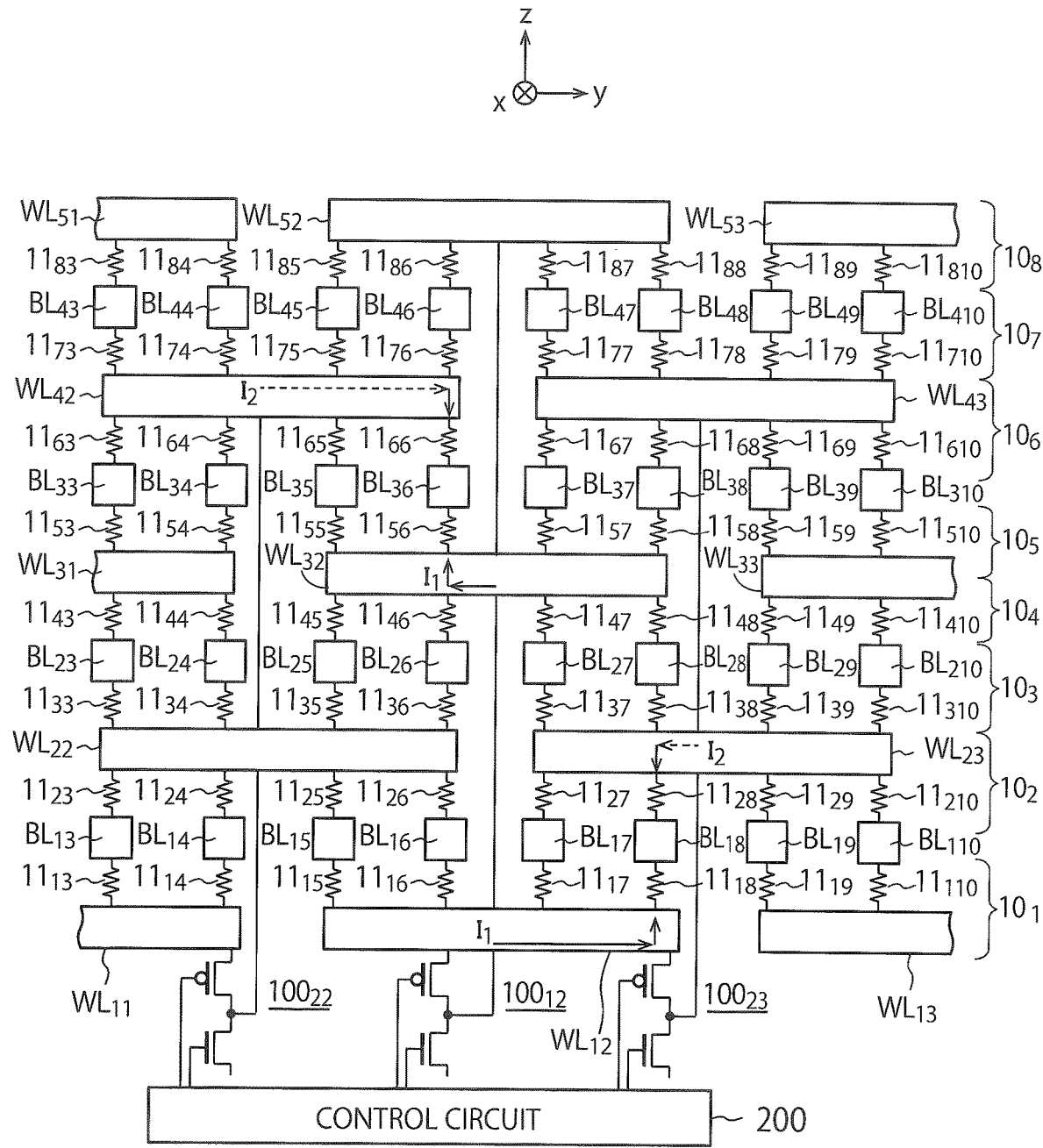
FIG. 7 is a schematic diagram of the semiconductor memory device according to a third embodiment.

A semiconductor memory device according to a third embodiment will be described with reference to FIG. 7. The semiconductor memory device according to the third embodiment has a structure obtained by further stacking a fifth semiconductor memory $10_5$, a sixth semiconductor memory $10_6$, a seventh semiconductor memory $10_7$, and an eighth semiconductor memory $10_8$ in this order in the z direction on the semiconductor memory device according to the second embodiment shown in FIG. 5. The fifth to eighth semiconductor memories $10_5$ to $10_8$ each have a crosspoint architecture.

The fifth semiconductor memory $10_5$ includes a plurality of (three in FIG. 7) word lines $WL_{31}$, $WL_{32}$, and $WL_{33}$, a plurality of (eight in FIG. 7) PCM elements $11_{53}$ to $11_{510}$, and a plurality of (eight in FIG. 7) bit lines $BL_{33}$ to $BL_{310}$. Thus, the fifth semiconductor memory $10_5$ and the fourth semiconductor memory $10_4$ share the word lines $WL_{31}$ to $WL_{33}$. The word lines $WL_{31}$, $WL_{32}$, and $WL_{33}$ extend in the y direction. The bit lines $BL_{33}$ to $BL_{310}$ extend in the x direction. The word lines $WL_{31}$, $WL_{32}$, and $WL_{33}$, the PCM elements $11_{53}$ to $11_{510}$, and the bit lines $BL_{33}$ to $BL_{310}$ are disposed at different levels in the z direction.

One ends of the PCM elements $11_{53}$ and $11_{54}$ are electrically connected to the word line $WL_{31}$, one end of the PCM element $11_{3i}$ (i=5, . . . , 8) is electrically connected to the word line $WL_{32}$, and one ends of the PCM elements $11_{59}$ and $11_{510}$ are electrically connected to the word line $WL_{33}$. The other end of each PCM element $11_{5i}$ (i=3, . . . , 10) is electrically connected to the bit line $BL_{3i}$.

The sixth semiconductor memory $10_6$ includes a plurality of (two in FIG. 7) word lines $WL_{42}$ and $WL_{43}$, a plurality of (eight in FIG. 7) PCM elements $11_{63}$ to $11_{610}$, and a plurality of (eight in FIG. 7) bit lines $BL_{33}$ to $BL1_{310}$. Thus, the sixth semiconductor memory $10_6$ and the fifth semiconductor memory $10_5$ share the bit lines $BL_{33}$ to $BL1_{310}$. The word lines $WL_{42}$ and $WL_{43}$ extend in the y direction. The word lines $WL_{42}$ and $WL_{43}$, the PCM elements $11_{63}$ to $11_{610}$, and the bit lines $BL_{33}$ to $BL1_{310}$ are disposed at different levels in the z direction.

The central portion of the word line $WL_{32}$ included in the fifth semiconductor memory $10_5$ is located below a space between the word line $WL_{42}$ and the word line $WL_{43}$, a central portion of the word line $WL_{42}$ included in the sixth semiconductor memory $10_6$ is located above a space between the word line $WL_{31}$ and the word line $WL_{32}$, and a central portion of the word line $WL_{43}$ included in the sixth semiconductor memory $10_6$ is located above a space between the word line $WL_{32}$ and the word line $WL_{33}$. Thus, the positions in the y direction of the word lines $WL_{31}$, $WL_{32}$, and $WL_{33}$ included in the fifth semiconductor memory $10_5$ and the positions in the y direction of the word lines $WL_{42}$ and $WL_{43}$ included in the sixth semiconductor memory $10_6$ are not the same.

One end of each of the PCM elements $11_{63}$ to $11_{66}$ is electrically connected to the word line $WL_{42}$, and one end of each of the PCM elements $11_{67}$ to $11_{610}$ is electrically connected to the word line $WL_{43}$. The other end of the PCM element $11_{6i}$ (i=3, . . . , 10) is electrically connected to the bit line $BL_{3i}$.

The seventh semiconductor memory $10_7$ includes a plurality of (two in FIG. 7) word lines $WL_{42}$ and $WL_{43}$, a plurality of (eight in FIG. 7) PCM elements $11_{73}$ to $11_{710}$, and a plurality of (eight in FIG. 7) bit lines $BL_{43}$ to $BL_{410}$. Thus, the seventh semiconductor memory $10_7$ and the sixth semiconductor memory $10_6$ share the word lines $WL_{42}$ and $WL_{43}$. The bit lines $BL_{43}$ to $BL_{410}$ extend in the x direction. The word lines $WL_{42}$ and $WL_{43}$, the PCM elements $11_{73}$ to $11_{710}$, and the bit lines $BL_{43}$ to $BL_{410}$ are disposed at different levels in the z direction.

One end of each of the PCM elements $11_{73}$ to $11_{76}$ is electrically connected to the word line $WL_{42}$, and one end of each of the PCM elements $11_{77}$ to $11_{710}$ is electrically connected to the word line $WL_{43}$. The other end of the PCM element $11_{7i}$, (i=3, . . . , 10) is electrically connected to the bit line $BL_{4i}$.

The eighth semiconductor memory $10_8$ includes a plurality of (three in FIG. 7) word lines $WL_{51}$, $WL_{52}$, and $WL_{53}$, a plurality of (eight in FIG. 7) PCM elements $11_{83}$ to $11_{810}$, and a plurality of (eight in FIG. 7) bit lines $BL_{43}$ to $BL_{410}$. Thus, the eighth semiconductor memory $10_8$ and the seventh semiconductor memory $10_7$ share the bit lines $BL_{43}$ to $BL_{410}$. The word lines $WL_{51}$, $WL_{52}$, and $WL_{53}$, the PCM elements $11_{83}$ to $11_{810}$, and the bit lines $BL_{43}$ to $BL_{410}$ are disposed in different levels in the z direction.

The word lines $WL_{51}$, $WL_{52}$, and $WL_{53}$ extend in the y direction. A region between the word line $WL_{42}$ and the word line $WL_{43}$ is located below a central portion of the word line $WL_{52}$ included in the eighth semiconductor memory $10_8$, a region between the word line $WL_{51}$ and the word line $WL_{52}$ is located above the central portion of the word line $WL_{42}$, and a region between the word line $WL_{52}$ and the word line $WL_{53}$ are located above the central portion of the word line $WL_{43}$. Thus, the positions in the y direction of the word lines $WL_{51}$, $WL_{52}$, and $WL_{53}$ included in the eighth semiconductor memory $10_8$ and the positions in the y direction of the word lines $WL_{42}$ and $WL_{43}$ included in the seventh semiconductor memory $10_7$ are not the same.

One end of each of the PCM elements $11_{83}$ and $11_{84}$ is electrically connected to the word line $WL_{51}$. One end of each of the PCM elements $11_{85}$ to $11_{88}$ is electrically connected to the word line $WL_{52}$. One end of each of the PCM elements $11_{89}$ and $11_{810}$ is electrically connected to the word line $WL_{53}$. The other end of the PCM element $11_{8i}$, (i=3, . . . , 10) is electrically connected to the bit line $BL_{4i}$.

One ends of two PCM elements that are not shown are electrically connected to each of the word lines $WL_{31}$ and $WL_{33}$, and the other ends are electrically connected to bit lines that are not shown. One ends of two PCM elements that are not shown are electrically connected to each of the word lines $WL_{51}$ and $WL_{53}$, and the other ends are electrically connected to bit lines that are not shown. Therefore, four PCM elements are electrically connected to each word line of the semiconductor memory according to the third embodiment shown in FIG. 7. The number of PCM elements electrically connected to each word line may be greater than four.

The semiconductor memory device according to the third embodiment includes driving circuits $100_{22}$, $100_{12}$, and $100_{23}$ that drive respective word lines, and a control circuit 200. In the case of FIG. 7, for example, the driving circuit $100_{22}$ is provided to deal with the word lines $WL_{22}$ and $WL_{42}$, the driving circuit $100_{12}$ is provided to deal with the word lines $WL_{12}$, and $WL_{52}$, and the driving circuit $100_{23}$ is provided to deal with the word lines $WL_{23}$ and $WL_{43}$. Thus, in the third embodiment, the word line $WL_{12}$ of the first semiconductor memory $10_1$, and the word line $WL_{32}$ of the fourth semiconductor memory $10_4$ and the word line $WL_{52}$ of the eighth semiconductor memory $10_8$, which are arranged at positions corresponding to the position of the word line $WL_{12}$, are connected to the same driving circuit $100_{12}$. The word line $WL_{22}$ of the second semiconductor memory $10_2$ and the word line $WL_{42}$ of the sixth semiconductor memory $10_6$, which is arranged at a position corresponding to the position of the word line $WL_{22}$, are connected to the driving circuit $100_{22}$. The word line $WL_{23}$ of the second semiconductor memory $10_2$ and the word line $WL_{43}$ of the sixth semiconductor memory $10_6$, which is arranged at a position corresponding to the position of the word line $WL_{23}$, are connected to the driving circuit $100_{23}$.

In the third embodiment, the word lines $WL_{11}$, $WL_{12}$, $WL_{13}$, $WL_{22}$, $WL_{23}$, $WL_{31}$, $WL_{32}$, $WL_{33}$, $WL_{42}$, $WL_{43}$, $WL_{51}$, $WL_{52}$, and $WL_{53}$ are located on a section of the semiconductor memory device sectioned by a y-z plane. Therefore, the same physical row address may be given to those word lines, for example.

Each of the driving circuits is electrically connected to the center of the corresponding word line. Each driving circuit supplies a write current or a read current to the PCM element to be accessed via the corresponding word line. The PCM elements connected to each word line are divided into two groups at the center of the word line. The number of PCM elements included in one group may be the same or different from the number of PCM elements included in the other group.

Each driving circuit includes a p-channel transistor and an n-channel transistor that are connected in series. An intermediate node (connection node) of the series-connected transistors is electrically connected to a central portion of the corresponding word line. The control circuit 200 controls the bit line corresponding to the PCM element to be accessed.

The semiconductor memory device according to the third embodiment having the above-described structure is capable of accessing two bits at a time. For example, as shown in FIG. 7, the control circuit 200 selects the driving circuit $100_{12}$ to access the PCM element $11_{18}$ arranged on the right side relative to the center of the word line $WL_{12}$, and to access the PCM element $11_{56}$ arranged on the left side relative to the center of the word line $WL_{32}$. At this time, the control circuit 200 also selects the bit lines $BL_{18}$ and $BL_{36}$.

In this case, the driving circuit $100_{12}$ supplies a current $I_1$ indicated by a solid line to the PCM element $11_{18}$ via the word line $WL_{12}$ and to the PCM element $11_{56}$ via the word line $WL_{32}$ to perform a write operation or a read operation.

At this time, addresses to be selected at the same time are provided to the bit line $BL_{18}$ and the bit line $BL_{36}$, which are electrically connected to the PCM element $11_{18}$ and the PCM element $11_{56}$, respectively, in the third embodiment.

As described before, after the addresses to be selected at the same time are provided to the bit line $BL_{18}$ and the bit line $BL_{36}$, the control circuit 200 drives the word line $WL_{23}$ by means of the driving circuit $100_{23}$, and selects the bit line $BL_{18}$ to access the PCM element $11_{28}$ electrically connected between the word line $WL_{23}$ and the bit line $BL_{18}$. At this time, the bit line $BL_{36}$, to which the address to be selected has been assigned at the same time as the bit line $BL_{18}$, has been selected. Therefore, in the third embodiment, the control circuit 200 drives the word line $WL_{42}$ by means of the driving circuit $100_{22}$. As a result, the PCM element $11_{66}$ that is electrically connected to the bit line $BL_{36}$ and the word line $WL_{42}$ is accessed. Thus, the PCM element $11_{66}$ and the PCM element $11_{28}$, which makes two bits, can be simultaneously accessed. A write operation or a read operation may be performed by supplying a current $I_2$ indicated by a broken line to the PCM element $11_{66}$ and the PCM element $11_{28}$ via the word line $WL_{42}$ and the word line $WL_{23}$, respectively, as shown in FIG. 7.

As described above, when two PCM elements (for example, the PCM elements $11_{18}$ and $11_{56}$), one ends of which are electrically connected to two word lines $WL_{12}$ and $WL_{32}$, are simultaneously accessed, the control circuit 200 also controls two other word lines (for example, the word lines $WL_{23}$ and $WL_{42}$) to be accessed. The other ends of two PCM elements (for example, the PCM elements $11_{28}$ and $11_{66}$), one ends of which are connected to two bit lines (for example, the bit lines $BL_{18}$ and $BL_{36}$) that are electrically connected to the other ends of the previously accessed two PCM elements, are connected to the two other word lines. When two PCM elements that are electrically connected to a word line are simultaneously accessed, one of the two PCM elements is disposed on the right side relative to the center of the word line, and the other is disposed on the left side. This may reduce the influence of a voltage drop caused by a read current or a write current, and may prevent the decrease in operation margin.

The semiconductor memory device according to the third embodiment is capable of accessing two bits in the manner described in the descriptions of the second embodiment.

As described above, the semiconductor memory device according to the third embodiment may prevent the decrease in operation margin, and prevent the complication in assigning addresses to be selected simultaneously.

Although the PCM elements $11_{18}$ and $11_{56}$ are selected from those connected to the two word lines $WL_{12}$ and $WL_{32}$ that are connected to the same driving circuit (for example the driving circuit $100_{12}$) in the third embodiment, the PCM elements (for example, the PCM elements $11_{18}$ and $11_{86}$) may be selected from those connected to other word lines (for example the word lines $WL_{12}$ and $WL_{52}$) connected to the driving circuit $100_{12}$. In this case, the PCM element selected via one word line is located on one side (for example, right side) relative to the center of the word line, and the PCM element selected via the other word line is located on the other side (for example, left side) relative to the center of the other word line. In this case, addresses to be selected at the same time are assigned to the bit line $BL_{18}$ and the bit line $BL_{46}$. Therefore, after a PCM element (for example, the PCM element $11_{76}$) connected to one of the bit lines $BL_{18}$ and $BL_{46}$ is selected, a PCM element $11_{28}$, which is connected to the bit line $BL_{18}$, to which the address has been assigned at the same time as the bit line $BL_{46}$, may be selected to perform two-bit access.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device, comprising:
a first wiring disposed at a first level parallel to a plane including a first direction and a second direction crossing the first direction, and the first wiring extending in the first direction;
a second wiring and a third wiring disposed at a second level parallel to the plane and extending in the first direction to be separate from each other, a position of the second level in a third direction that is perpendicular to the plane being different from a position of the first level in the third direction;
a plurality of fourth wirings disposed at a third level parallel to the plane and between the first level and the second level, the plurality of fourth wirings extending in the second direction;
a plurality of first resistive change elements disposed in intersection regions of the first wiring and the plurality of fourth wirings, each of the plurality of first resistive change elements including a first terminal and a second terminal, the first terminal being electrically connected to the first wiring, and the second terminal being electrically connected to a corresponding one of the plurality of fourth wirings;
a plurality of second resistive change elements disposed in intersection regions between the second wiring and the plurality of fourth wirings and between the third wiring and the plurality of fourth wirings, each of the plurality of second resistive change elements including a third terminal and a fourth terminal, the third terminal being electrically connected to a corresponding wiring selected from the second wiring and the third wiring, or the fourth terminal being electrically connected to a corresponding one of the plurality of fourth wirings;
a first driving circuit electrically connected to the first wiring, a second driving circuit electrically connected to the second wiring, and a third driving circuit electrically connected to the third wiring; and
a control circuit that controls the first driving circuit, the second driving circuit, and the third driving circuit, and also the plurality of fourth wirings,
the plurality of first resistive change elements being divided into a first group located on one side and a second group located on another side relative to a portion of the first wiring,
the plurality of second resistive change elements, the third terminal of each of which is electrically connected to the second wiring, being divided into a third group located on one side and a fourth group located on another side relative to a portion of the second wiring, and the plurality of second resistive change elements, the third terminal of each of which is electrically connected to the third wiring, being divided into a fifth group located on one side and a sixth group located on another side relative to a portion of the third wiring, the control circuit selecting the first driving circuit to select the first wiring connected to the first driving circuit that is selected, selecting one of the plurality of first resistive change elements in the first group, selecting one of the plurality of first resistive change elements in the second group, during an operation to access the two first resistive change elements that are selected, providing addresses to be selected simultaneously to two of the plurality of fourth wirings, to which the second terminals of the two first resistive change elements that are selected are connected, and providing addresses to be selected simultaneously to the second wiring and the third wiring, to which the third terminals of two second resistive change elements are connected, the fourth terminals of the two second resistive change elements being connected to the two of the plurality of fourth wirings.

2. The semiconductor memory device according to claim 1, wherein a region between the second wiring and the third wiring is aligned with the portion of the first wiring in the third direction.

3. The semiconductor memory device according to claim 1, wherein at least one of the plurality of first resistive change elements or the plurality of second resistive change elements contain a chalcogenide.

4. A semiconductor memory device, comprising:
a first wiring disposed at a first level parallel to a plane including a first direction and a second direction crossing the first direction, and the first wiring extending in the first direction;
a second wiring and a third wiring disposed at a second level parallel to the plane and extending in the first direction to be separate from each other, a position of the second level in a third direction that is perpendicular to the plane being different from a position of the first level in the third direction;
a plurality of fourth wirings disposed at a third level parallel to the plane and between the first level and the second level, the plurality of fourth fourth wirings extending in the second direction;
a plurality of first resistive change elements disposed in intersection regions of the first wiring and the plurality of fourth wirings, each of the plurality of first resistive change elements including a first terminal and a second terminal, the first terminal being electrically connected to the first wiring, and the second terminal being electrically connected to corresponding one of the plurality of fourth wirings;
a plurality of second resistive change elements disposed in intersection regions between the second wiring and the plurality of fourth wirings and between the third wiring and the plurality of fourth wirings, each of the plurality of second resistive change elements including a third terminal and a fourth terminal, the third terminal being electrically connected to a corresponding wiring selected from the second wiring and the third wiring, and the fourth terminal being electrically connected to a corresponding one of the plurality of fourth wirings;
a fifth wiring disposed at a fourth level parallel to the plane, a position of the fourth level in the third direction being different from the positions of the first level, the second level, and the third level in the third direction, the second level being located between the fourth level and the third level, the fifth wiring extending in the first direction;
a plurality of sixth wirings disposed at a fifth level parallel to the plane and between the fourth level and the second level, the plurality of sixth wirings extending in the second direction;
a plurality of third resistive change elements disposed in intersection regions between the fifth wiring and the plurality of sixth wirings, each of the plurality of third resistive change elements including a fifth terminal and a six terminal, the fifth terminal being electrically connected to the fifth wiring, and the six terminal being electrically connected to a corresponding one of the plurality of sixth wirings; and
a plurality of fourth resistive change elements disposed in intersection regions between the second wiring and the sixth wirings and between the third wiring and the plurality of sixth wirings, each of the plurality of fourth resistive change elements including a seventh terminal and an eighth terminal, the seventh terminal being electrically connected to corresponding one of the second wiring and the third wiring, and the eighth terminal being electrically connected to corresponding one of the plurality of sixth wirings, the plurality of first resistive change elements being divided into a first group located on one side and a second group located on another side relative to a portion of the first wiring, the plurality of second resistive change elements, the third terminal of each of which is electrically connected to the second wiring, being divided into a third group located on one side and a fourth group located on another side relative to a portion of the second wiring, and the plurality of second resistive change elements, the third terminal of each of which is electrically connected to the third wiring, being divided into a fifth group located on one side and a sixth group located on another side relative to a portion of the third wiring, the plurality of third resistive change elements being divided into a seventh group located on one side and an eighth group located on another side relative to a portion of the fifth wiring, the plurality of fourth resistive change elements, the seventh terminal of each of which is electrically connected to the second wiring, being divided into a ninth group located on one side and a tenth group located on another side relative to a portion of the second wiring, and the plurality of fourth resistive change elements, the seventh terminal of each of which is electrically connected to the third wiring, being divided into an eleventh group located on one side and a twelfth group located on another side relative to a portion of the third wiring, and the portion of the first wiring being electrically connected to the portion of the fifth wiring.

5. The semiconductor memory device according to claim 4, wherein a region between the second wiring and the third wiring is aligned with the portion of the first wiring in the third direction, and the region between the second wiring and the third wiring is aligned with the portion of the fifth wiring in the third direction.

6. The semiconductor memory device according to claim 4, wherein at least one of the plurality of first resistive change elements, the plurality of second resistive change elements, the third plurality of resistive change elements, or the plurality of fourth resistive change elements contains a chalcogenide.

7. The semiconductor memory device according to claim 4, further comprising:

a first driving circuit electrically connected to the first wiring and the fifth wiring;
a second driving circuit electrically connected to the second wiring;
a third driving circuit electrically connected to the third wiring; and
a control circuit that controls the first driving circuit, the second driving circuit, and the third driving circuit, and also the plurality of fourth wirings and the plurality of sixth wirings,
wherein the control circuit selects the first driving circuit to select the first wiring and the fifth wiring connected to the first driving circuit, selects one of the plurality of first resistance elements in the first group and the second group and one of the plurality of third resistive change elements in the seventh group and the eighth group, the one of the plurality of first resistive change elements selected from the first group and the second group and the one of the plurality of third resistive change elements selected from the seventh group and the eighth group being located on opposite sides relative to a straight line connecting the portion of the first wiring and the portion of the fifth wiring, during an operation to access the one of the plurality of first resistive change elements that is selected and the one of the plurality of third resistive change elements that is selected, provides addresses to be selected simultaneously to the fourth wiring to which the second terminal of the one of the plurality of first resistive change elements that is selected is connected and the sixth wiring to which the six terminal of the one of the plurality of third resistive change elements that is selected is connected, and provides addresses to be selected simultaneously to one of the second wiring and the third wiring, to which the third terminal of the second resistive change element is connected, the fourth terminal of the second resistive change element being connected to the fourth wiring to which the address is provided, and the other of the second wiring and the third wiring, to which the seventh terminal of the fourth resistive change element is connected, the eighth terminal of the fourth resistive change element being connected to the sixth wiring to which the address is provided.

8. The semiconductor memory device according to claim 7, wherein a region between the second wiring and the third wiring is aligned with the portion of the first wiring in the third direction, and the region between the second wiring and the third wiring is aligned with the portion of the fifth wiring in the third direction.

9. The semiconductor memory device according to claim 7, wherein at least one of the plurality of first resistive change elements, the plurality of second resistive change elements, the plurality of third resistive change elements, and the plurality of fourth resistive change elements contains a chalcogenide.

10. The semiconductor memory device according to claim 4, further comprising:
a seventh wiring and an eighth wiring disposed at a sixth level parallel to the plane and extending in the first direction to be separate from each other, a position of the sixth level in the third direction being different from the positions of the first level, the second level, the third level, the fourth level, and the fifth level in the third direction, the fourth level being located between the sixth level and the fifth level;
a plurality of ninth wirings disposed at a seventh level parallel to the plane and extending in the second direction, the seventh level between the sixth level and the fourth level;
a plurality of fifth resistive change elements disposed in intersection regions between the seventh wiring and the plurality of ninth wirings and between the eighth wiring and the plurality of ninth wirings, each of the plurality of fifth resistive change elements including a ninth terminal and a tenth terminal, the ninth terminal being electrically connected to a corresponding one of the seventh wiring and the eighth wiring, and the tenth terminal being electrically connected to a corresponding one of the plurality of ninth wirings; and
a plurality of sixth resistive change elements disposed in intersection regions between the fifth wiring and the plurality of ninth wirings, each of the plurality of sixth resistive change elements including an eleventh terminal and a twelfth terminal, the eleventh terminal being electrically connected to the fifth wiring, and the twelfth terminal being electrically connected to a corresponding one of the plurality of ninth wirings,
wherein the plurality of fifth resistive change elements, the ninth terminal of each of which is electrically connected to the seventh wiring, are divided into a thirteenth group located on one side and a fourteenth group located on another side relative to a portion of the seventh wiring,
the plurality of fifth resistive change elements, the ninth terminal of each of which is electrically connected to the eighth wiring, are divided into a fifteenth group located on one side and a sixteenth group located on another side relative to a portion of the eighth wiring,
the plurality of sixth resistive change elements are divided into a seventeenth group located on one side and an eighteenth group located on another side relative to the portion of the fifth wiring, and
wherein the portion of the second wiring is electrically connected to the portion of the seventh wiring, and the portion of the third wiring is electrically connected to the portion of the eighth wiring.

11. The semiconductor memory device according to claim 10, wherein a region between the second wiring and the third wiring is aligned with the portion of the first wiring in the third direction, the region between the second wiring and the third wiring is aligned with the portion of the fifth wiring in the third direction, and a region between the seventh wiring and the eighth wiring is aligned with the portion of the fifth wiring in the third direction.

12. The semiconductor memory device according to claim 10, wherein at least one of the plurality of first resistive change elements, the plurality of second resistive change elements, the plurality of third resistive change elements, the plurality of fourth resistive change elements, the plurality of fifth resistive change elements, or the plurality of sixth resistive change elements contains a chalcogenide.

13. The semiconductor memory device according to claim 10, further comprising:
a first driving circuit electrically connected to the first wiring and the fifth wiring;
a second driving circuit electrically connected to the second wiring and the seventh wiring;
a third driving circuit electrically connected to the third wiring and the eighth wiring; and
a control circuit that controls the first driving circuit, the second driving circuit, and the third driving circuit, and also the plurality of fourth wirings, the plurality of sixth wirings, and the plurality of ninth wirings, wherein the control circuit selects the first driving circuit to select the first wiring and the fifth wiring connected to the first driving circuit, selects one of the plurality of first resistance change elements in the first group and the second group or one of the plurality of sixth resistive change elements in the seventeenth group or the eighteenth group, the one of the plurality of first resistive change elements selected from the first group or the second group and the one of the plurality of sixth resistive change elements selected from the seventeenth group or the eighteenth group being located on opposite sides relative to a straight line connecting the portion of the first wiring and the portion of the fifth wiring, during an operation to access the one of the plurality of first resistive change elements that is selected and the one of the plurality of sixth resistive change elements that is selected, provides addresses to be selected simultaneously to the fourth wiring to which the second terminal of the one of the plurality of first resistive change elements that is selected is connected and the ninth wiring to which the twelfth terminal of the one of the plurality of sixth resistive change elements that is selected is connected, and provides addresses to be selected simultaneously to one of the second wiring and the third wiring to which the third terminal of the second resistive change element is connected, the fourth terminal of the second resistive change element being connected to the fourth wiring to which the address is provided, and one of the seventh wiring and the eighth wiring to which the ninth terminal of the fifth resistive change element is connected, the tenth terminal of the fifth resistive change element being connected to the ninth wiring to which the address is provided.

14. The semiconductor memory device according to claim 13, wherein a region between the second wiring and the third wiring is aligned with the portion of the first wiring in the third direction, the region between the second wiring and the third wiring is aligned with the portion of the fifth wiring in the third direction, and a region between the seventh wiring and the eighth wiring is aligned with the portion of the fifth wiring in the third direction.

15. The semiconductor memory device according to claim 13, wherein at least one of the plurality of first resistive change elements, the plurality of second resistive change elements, the plurality of third resistive change elements, the plurality of fourth resistive change elements, the plurality of fifth resistive change elements, or the plurality of sixth resistive change elements contains a chalcogenide.

* * * * *